United States Patent
Nonoguchi et al.

(10) Patent No.: US 10,367,130 B2
(45) Date of Patent: Jul. 30, 2019

(54) METHOD FOR PRODUCING NANOMATERIAL-DOPANT COMPOSITION COMPOSITE, NANOMATERIAL-DOPANT COMPOSITION COMPOSITE, AND DOPANT COMPOSITION

(71) Applicants: NATIONAL UNIVERSITY CORPORATION NARA INSTITUTE OF SCIENCE AND TECHNOLOGY, Nara (JP); SEKISUI CHEMICAL CO., LTD., Osaka (JP)

(72) Inventors: Yoshiyuki Nonoguchi, Nara (JP); Tsuyoshi Kawai, Nara (JP); Fumihiko Kamikonya, Nara (JP); Kenji Ohashi, Nara (JP); Kazuhiro Takeda, Nara (JP)

(73) Assignees: NATIONAL UNIVERSITY CORPORATION NARA INSTITUTE OF SCIENCE AND TECHNOLOGY, Nara (JP); SEKISUI CHEMICAL CO., LTD., Osaka (JP)

( * ) Notice: Subject to any disclaimer, the term of this patent is extended or adjusted under 35 U.S.C. 154(b) by 245 days.

(21) Appl. No.: 15/312,287

(22) PCT Filed: Feb. 10, 2015

(86) PCT No.: PCT/JP2015/053603
§ 371 (c)(1),
(2) Date: Nov. 18, 2016

(87) PCT Pub. No.: WO2015/198621
PCT Pub. Date: Dec. 30, 2015

(65) Prior Publication Data
US 2017/0110646 A1 Apr. 20, 2017

(30) Foreign Application Priority Data

Jun. 26, 2014 (JP) .................................. 2014-131907

(51) Int. Cl.
| | | |
|---|---|---|
| *B82Y 30/00* | (2011.01) | |
| *B82Y 40/00* | (2011.01) | |
| *C01B 19/02* | (2006.01) | |
| *H01L 35/16* | (2006.01) | |
| *H01L 35/22* | (2006.01) | |
| *H01L 35/28* | (2006.01) | |
| *H01L 35/34* | (2006.01) | |
| *H01L 51/00* | (2006.01) | |
| *H01L 51/05* | (2006.01) | |
| *C01B 32/174* | (2017.01) | |
| *C01B 32/194* | (2017.01) | |
| *H01L 35/24* | (2006.01) | |

(52) U.S. Cl.
CPC .............. *H01L 35/24* (2013.01); *C01B 19/02* (2013.01); *C01B 32/174* (2017.08); *C01B 32/194* (2017.08); *H01L 35/16* (2013.01); *H01L 35/22* (2013.01); *H01L 35/28* (2013.01); *H01L 35/34* (2013.01); *H01L 51/0048* (2013.01); *B82Y 30/00* (2013.01); *B82Y 40/00* (2013.01); *C01B 2202/02* (2013.01); *C01B 2202/06* (2013.01); *C01B 2202/22* (2013.01); *C01B 2204/02* (2013.01); *H01L 51/0545* (2013.01); *H01L 51/0558* (2013.01); *Y10S 977/734* (2013.01); *Y10S 977/751* (2013.01); *Y10S 977/752* (2013.01); *Y10S 977/762* (2013.01); *Y10S 977/842* (2013.01); *Y10S 977/892* (2013.01); *Y10S 977/932* (2013.01)

(58) Field of Classification Search
CPC ......... H01L 35/14; H01L 35/16; H01L 35/18; H01L 35/22; H01L 35/24; H01L 35/34; B82Y 40/00; C01B 32/174; C01B 19/02; C01B 2202/02; C01B 2202/22; C01B 2202/24
See application file for complete search history.

(56) References Cited

U.S. PATENT DOCUMENTS

| | | | | |
|---|---|---|---|---|
| 3,654,261 A | * | 4/1972 | Johnson | .................. C08L 63/00 106/14.42 |
| 8,518,491 B2 | * | 8/2013 | Garces | .................... C23C 16/02 427/248.1 |

(Continued)

FOREIGN PATENT DOCUMENTS

| | | |
|---|---|---|
| EP | 2693444 A1 | 2/2014 |
| JP | 2005-514447 A | 5/2005 |
| JP | 2009-292714 A | 12/2009 |
| JP | 2013-084947 A | 5/2013 |
| KR | 2008-0098664 A | 11/2008 |
| WO | 2012/133314 A1 | 10/2012 |
| WO | 2013/065631 A1 | 5/2013 |

OTHER PUBLICATIONS

Wang et al, "Improving the Degree of Functionaliziation and Solubility of Single-Walled Carbon Nanotubes via Covalent Multiple Functionalization", J. Inorg. Organoemat Polym, 22, May 19, 2012, pp. 1182-1188.*

(Continued)

*Primary Examiner* — C Melissa Koslow
(74) *Attorney, Agent, or Firm* — Osha Liang LLP (57) ABSTRACT

The present invention provides a method for manufacturing a dopant composition-nanomaterial composite, which method makes it possible to simply and efficiently change a Seebeck coefficient value of a nanomaterial. This manufacture method of the present invention includes the steps of: (a) putting a dopant composition in contact with a nanomaterial in a solvent; (b) drying a mixture obtained in the step (a) so as to remove the solvent, the dopant composition containing a given anion and an onium ion.

6 Claims, 7 Drawing Sheets

(56) References Cited

U.S. PATENT DOCUMENTS

| | | | |
|---|---|---|---|
| 8,603,836 B2 | 12/2013 | Yoon et al. | |
| 2003/0121787 A1* | 7/2003 | Reiter | B01D 61/445 204/537 |
| 2009/0022650 A1 | 1/2009 | Choi et al. | |
| 2009/0142581 A1 | 6/2009 | Heintz et al. | |
| 2009/0317660 A1 | 12/2009 | Heintz et al. | |
| 2010/0140561 A1 | 6/2010 | Choi et al. | |
| 2011/0215416 A1 | 9/2011 | Choi et al. | |
| 2014/0020939 A1 | 1/2014 | Nishio et al. | |
| 2014/0060602 A1 | 3/2014 | Aoai et al. | |
| 2014/0230871 A1 | 8/2014 | Nishio et al. | |
| 2014/0251407 A1 | 9/2014 | Nishio et al. | |
| 2016/0268014 A1 | 9/2016 | Heintz et al. | |
| 2017/0002212 A1 | 1/2017 | Heintz et al. | |

OTHER PUBLICATIONS

Office Action issued in Korean Application No. 10-2016-7030294, dated Jun. 20, 2018 (14 pages).

Notice of allowance issued in Japanese Application No. 2014-131907; dated Jul. 4, 2017 (7 pages).

International Search Report and Written Opinion dated Apr. 7, 2015, issued by the Japan Patent Office in corresponding International Application No. PCT/JP2015/053603, with English translation (10 pages).

International Preliminary Report on Patentability dated Dec. 27, 2016, issued by the International Bureau of WIPO in corresponding International Application No. PCT/JP2015/053603, with English translation (9 pages).

Suemori, Kouji, et al., "Flexible and lightweight thermoelectric generators composed of carbon nanotube-polystyrene composites printed on film substrate"; Applied Physics Letters 103, 153902 (2013); doi: 10.1063/1.4824648; online: http://dx.doi.org/10.1063/1.4824648, published by AIP Publishing LLC (5 pages).

Czerw, R., et al., "Identification of Electron Donor States in N-Doped Carbon Nanotubes"; Nano Letters, vol. 1, No. 9 (2001), American Chemical Society; pp. 457-460.

Lee, R. S., et al., "Conductivity enhancement in single-walled carbon nanotube bundles doped with K and Br"; Nature, vol. 388, Jul. 17, 1997; pp. 255-257.

Shim,, Moonsub, et al., "Polymer Functionalization for Air-Stable n-Type Carbon Nanotube Field-Effect Transistors"; J. Am. Chem. Soc. vol. 123, 2001; pp. 11512-11513.

Ryu, Yeontack, et al., "High electrical conductivity and n-type thermopower from double-/single-wall carbon nanotube by manipulating charge interactions between nanotubes and organic/inorganic nanomaterials"; ScienceDirect—Carbon 49 (2011); doi: 10.1016/j.carbon.2011.06.082; Elsevier Ltd.; pp. 4745-4751.

Kim, Soo Min, et al., "Reduction-Controlled Viologen in Bisolvent as an Environmentally Stable n-Type Dopant for Carbon Nanotubes"; J. Am. Chem. Soc., vol. 131, 2009; pp. 327-331.

Nonoguchi, Yoshiyuki, et al., "Systematic Conversion of Single Walled Carbon Nanotubes into n-type Thermoelectric Materials by Molecular Dopants"; Scientific Reports, vol. 3: 3344; DOI: 10.1038/srep03344; published Nov. 26, 2013; pp. 1-7.

Extended European Search Report issued in European Application No. 15811639.2; dated Oct. 4, 2017 (9 pages).

Lee et al. "Colloidal suspensions of N-modified graphene nano-platelets in water and organic solvent/water mixed systems", Solid State Sciences, Elsevier, Paris, FR, vol. 27, Nov. 1, 2013, pp. 1-4, XP028670728, ISSN: 1293-2558 (4 pages).

Liu et al. "A magnetic graphene hybrid functionalized with beta-cyclodextrins for fast and efficient removal of organic dyes", Journal of Materials Chemistry A: Materials for Energy and Sustainability, vol. 2, No. 31, Apr. 23, 2014, p. 12296-12303, XP055407225, GB ISSN: 2050-7488 (9 pages).

Su et al. "Low-temperature synthesis of nitrogen/sulfur co-doped three-dimensional graphene frameworks as efficient metal-free electrocatalyst for oxygen reduction reaction", Carbon, vol. 62, Jun. 13, 2013, pp. 296-301, XP028678191, ISSN: 0008-6223 (6 pages).

Wang et al. "Improving the degree of functionalization and solubility of single-walled carbon nanotubes via covalent multiple functionalization", Journal of Inorganic and Organometallicpolymers, Kluwer Academic Publishers-Plenum Publishers, NE, vol. 22, No. 5, May 19, 2012, pp. 1182-1188, XP035100345, ISSN:1574-1451 (7 pages).

Hu et al. "Rapid synthesis of nitrogen-doped graphene for a lithium ion battery anode with excellent rate performance and super-long cyclic stability", Physical Chemistry Chemical Physics.,vol. 16, No. 3, Nov. 4, 2013, pp. 1060-1066, XP055407243,GB ISSN: 1463-9076 (7 pages).

Office Action issued in corresponding European Application No. 15811639.2; dated Mar. 7, 2019 (7 pages).

\* cited by examiner

METHOD FOR PRODUCING NANOMATERIAL-DOPANT COMPOSITION COMPOSITE, NANOMATERIAL-DOPANT COMPOSITION COMPOSITE, AND DOPANT COMPOSITION

TECHNICAL FIELD

The present invention relates to a method for manufacturing a dopant composition-nanomaterial composite, the dopant composition-nanomaterial composite and a dopant composition.

BACKGROUND ART

In recent years, in the fields of thermoelectric conversion elements, field-effect transistors, sensors, integrated circuits, rectifying elements, photovoltaic cells, catalysts, electroluminescence, and the like, attention has been drawn to use of nanomaterials for making a flexible element or a small and light-weight element.

Figure 1:
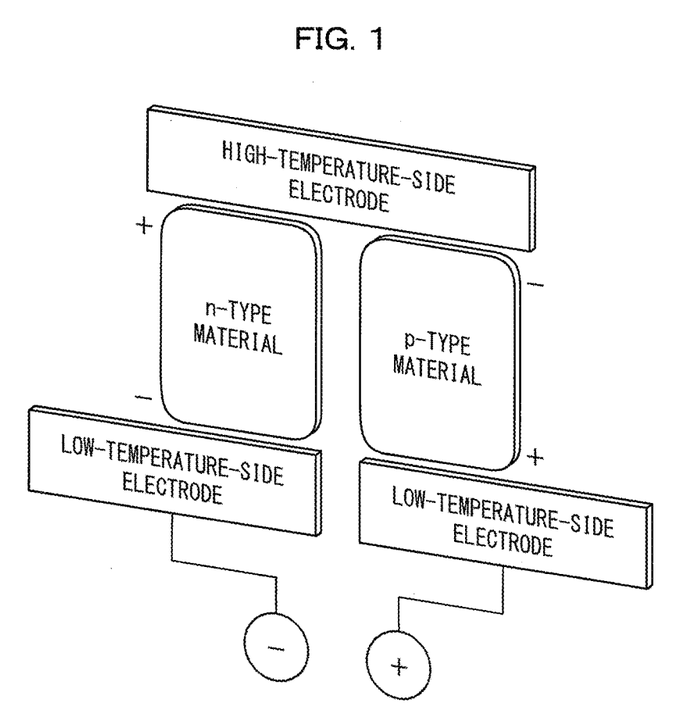
FIG. 1 is a view schematically illustrating an example of a bipolar thermoelectric conversion element that includes an n-type material and a p-type material.

In the above fields, it is typically preferable to use a bipolar element which includes both a material exhibiting p-type conductivity and a material exhibiting n-type conductivity. For example, thermoelectric conversion elements are elements used for thermoelectric generation, in which power is generated by utilizing potential difference which occurs in a substance due to temperature difference. According to a thermoelectric conversion element including only one of a thermoelectric conversion material exhibiting p-type conductivity and a thermoelectric conversion material exhibiting n-type conductivity, power generation efficiency is poor. This is because heat is lost through a high-temperature-side terminal. FIG. 1 is a view schematically illustrating a bipolar thermoelectric conversion element which employs both a thermoelectric conversion material having n-type conductivity (n-type material) and a thermoelectric conversion material having p-type conductivity (p-type material). In a case where such a bipolar thermoelectric conversion element is used, power can be efficiently generated by connecting the thermoelectric conversion material having n-type conductivity and the thermoelectric conversion material having p-type conductivity in series.

Patent Literature 1 and Non-Patent Literature 1 each disclose a thermoelectric conversion material containing a carbon nanotube. The carbon nanotube utilized in technologies disclosed in Patent Literature 1 and Non-Patent Literature 1 is mainly a nanomaterial having p-type conductivity. As in the cases disclosed in Patent Literature 1 and Non-Patent Literature 1, nanomaterials often exhibit p-type conductivity. Accordingly, there is a demand for a technique for converting a nanomaterial exhibiting p-type conductivity into a nanomaterial exhibiting n-type conductivity. Note that a polarity of a nanomaterial (that is, whether a nanomaterial exhibits p-type conductivity or n-type conductivity) can be determined depending on whether a Seebeck coefficient is positive or negative. In other words, the technique for converting a polarity of a nanomaterial is a technique for changing a Seebeck coefficient.

For example, studies are made on conversion of a carbon nanotube exhibiting p-type conductivity into a carbon nanotube exhibiting n-type conductivity. So far, it has been reported that nitrogen atom exchange, alkali metal doping, or the like allows for conversion of a carbon nanotube having p-type conductivity into a carbon nanotube having n-type conductivity (for example, see Non-Patent Literatures 2 and 3).

Further, Non-Patent Literatures 4 and 5 each disclose that doping of a carbon nanotube with polyethylenimine allows for conversion of a carbon nanotube having p-type conductivity into a carbon nanotube having n-type conductivity. In addition, it has been reported that benzylviologen, ammonium and nicotinamide each can be also used as a dopant for converting a carbon nanotube having p-type conductivity into a carbon nanotube having n-type conductivity (see Non-Patent Literature 6, and Patent Literatures 2 and 3).

Furthermore, the inventors of the present invention have found that: several dopants are each capable of converting a single walled carbon nanotube having p-type conductivity into a single walled carbon nanotube having n-type conductivity; and each of these dopants has a HOMO level in a specific range (see Non-Patent Literature 7).

CITATION LIST

Patent Literatures

[Patent Literature 1]
Pamphlet of PCT International Publication No. WO 2013/065631 (Publication Date: May 10, 2013)
[Patent Literature 2]
Specification of U.S. Pat. No. 8,603,836 (Registration Date: Dec. 10, 2013)
[Patent Literature 3]
Japanese Patent Application Publication, Tokukai, No. 2009-292714 (Publication Date: Dec. 17, 2009)

Non-Patent Literatures

[Non-Patent Literature 1]
K. Suemori et al., Appl. Phys. Lett., 2013, 103, 153902.
[Non-Patent Literature 2]
R. Czerw et al, Nano Lett., 2001, VOL. 1, NO. 9, 457-460.
[Non-Patent Literature 3]
R. S. Lee et al., Nature, 2001, VOL. 388, 255-257.
[Non-Patent Literature 4]
M. Shim et al., J. Am. Chem. Soc., 2001, 123, 11512-11513.
[Non-Patent Literature 5]
Y. Ryu et al, Carbon, 2011, 49, 4745-4751.
[Non-Patent Literature 6]
S. M. Kim et al., J. Am. Chem. Soc., 2009, 131, 327-331.
[Non-Patent Literature 7]
Y. Nonoguchi et al., Sci. Rep., 2013, 3, 3344.

SUMMARY OF INVENTION

Technical Problem

However, a method for changing a Seebeck coefficient of a nanomaterial has not yet been systemized. In other words, though several dopants (n-type dopants) for conversion of a nanomaterial having p-type conductivity into a nanomaterial having n-type conductivity have been reported, a substance similar in property or structure to those known dopants cannot always serve as an n-type dopant in the same way as the known dopants. Accordingly, it is inevitable to employ a trial-and-error method for development of a novel dopant. The trial-and-error method requires considerable amounts of cost, time and labor before attainment of a novel dopant, and is highly inefficient.

Furthermore, in a conventional method for manufacturing a carbon nanotube having n-type conductivity, for example, heating (e.g., Patent Literature 3) and/or the like is required. Accordingly, the conventional method is not simple in operation. On this account, it is not easy to mass-produce carbon nanotubes having n-type conductivity. Meanwhile, in a technique disclosed in Non-Patent Literature 7, a dopant whose cost is higher than a certain level is used. Additionally, the technique disclosed in Non-Patent Literature 7 requires use of an organic solvent, and further is limited to application to single walled carbon nanotubes. In view of the above, there is a demand for a more simple and efficient method for manufacturing a nanomaterial having n-type conductivity.

The present invention is attained in view of the above problems. An object of the present invention is to provide a method for simply and efficiently changing a Seebeck coefficient value of a nanomaterial.

Solution to Problem

As a result of diligent studies for solving the above problem, the inventors of the present invention have uniquely found the followings: (i) anions can be widely used as dopants; and (ii) use of an onium ion as a cation which is a counter ion of an anion allows for efficient doping with the anion. The inventors of the present invention have then revealed that use of the anion as a dopant makes it possible to simply and efficiently change a Seebeck coefficient of a nanomaterial.

That is, a method for manufacturing a dopant-nanomaterial composite in accordance with the present invention is a method for manufacturing a dopant composition-nanomaterial composite, the method including the steps of: (a) putting a dopant composition in contact with a nanomaterial in a solvent; and (b) drying a mixture obtained in the step (a) so as to remove the solvent, the dopant composition being a composition for changing a Seebeck coefficient of the nanomaterial, the dopant composition containing an anion and a cation, the anion being at least one selected from the group consisting of hydroxy ions, alkoxy ions, thio ions, alkyl thio ions, cyanide ions, and carboxy ions, the cation being an onium ion, a dopant composition-nanomaterial composite obtained in the step (b) having the anion and the cation in a state where the anion and the cation are dissociated from each other.

A dopant composition in accordance with the present invention is a dopant composition for changing a Seebeck coefficient of a nanomaterial, the dopant composition including: an anion; and a cation, the anion being at least one selected from the group consisting of hydroxy ions, alkoxy ions, thio ions, alkyl thio ions, cyanide ions, and carboxy ions, the cation being an onium ion.

Advantageous Effects of Invention

A method for manufacturing a dopant composition-nanomaterial composite in accordance with the present invention is a method for manufacturing a dopant composition-nanomaterial composite, the method including the steps of: (a) putting a dopant composition in contact with a nanomaterial in a solvent; and (b) drying a mixture obtained in the step (a) so as to remove the solvent, the dopant composition being a composition for changing a Seebeck coefficient of the nanomaterial, the dopant composition containing an anion and a cation, the anion being at least one selected from the group consisting of hydroxy ions, alkoxy ions, thio ions, alkyl thio ions, cyanide ions, and carboxy ions, the cation being an onium ion, a dopant composition-nanomaterial composite obtained in the step (b) having the anion and the cation in a state where the anion and the cation are dissociated from each other.

Therefore, it is possible to provide a method for manufacturing a dopant-nanomaterial composite composition, which method allows a Seebeck coefficient value of a nanomaterial to be simply and efficiently changed.

DESCRIPTION OF EMBODIMENTS

The following discusses in detail an example of embodiments of the present invention. The present invention is, however, by no means limited to those embodiments. Note that the numerical range "A to B" herein means "not less than A and not more than B" unless otherwise noted.

[Method for Manufacturing Dopant Composition-Nanomaterial Composite]

A method, in accordance with the present invention, for manufacturing a dopant composition-nanomaterial composite (hereinafter, also referred to as "a manufacture method of the present invention") includes the step of putting a dopant composition in contact with a nanomaterial in a solvent, the dopant composition being a composition for changing a Seebeck coefficient of the nanomaterial.

<Nanomaterial>

The term "nanomaterial" herein means a substance having a nanoscale size (e.g., not more than 100 nm) at least in one direction. The nanomaterial is a material used as, for example, an electronic material.

The nanomaterial can be a low-dimensional nanomaterial. The term "low dimensional" herein means having the number of dimensions lower than three. That is, the term "low dimensional" herein means "zero dimensional", "one dimensional", or "two dimensional".

Zero-dimensional nanomaterials can be, for example, nanoparticles (quantum dots). One-dimensional nanomaterials can be, for example, nanotubes, nanowires, or nanorods. Two-dimensional nanomaterials can be, for example, nanosheets.

The nanomaterial can be a nanomaterial containing at least one selected from the group consisting of carbon, semiconductor, semimetal, and metal. Examples of nanomaterials made of carbon encompass carbon nanotubes and graphenes (i.e., nanosheets made of carbon). In the present specification, the carbon nanotubes may be referred to as "CNTs".

Examples of the semiconductor encompass iron silicide, sodium cobaltate, and antimony telluride. Examples of the semimetal encompass tellurium, boron, germanium, arsenic, antimony, selenium, and graphite. Examples of the metal encompass gold, silver, copper, platinum, and nickel.

The nanotubes and the nanosheets can have a single-layer structure or a multi-layer (two-layer, three-layer, four-layer or more-than-four-layer) structure. The nanotubes can be made of carbon. In the present specification, single-layer carbon nanotubes may be referred to as SWNTs (single-wall carbon nanotubes), while multi-layer carbon nanotubes may be referred to as MWNTs (multi-wall carbon nanotubes).

<Dopant Composition>

The term "dopant composition" herein means a composition containing a dopant. Further, the term "dopant" herein means a substance which changes a Seebeck coefficient of a material doped with the substance. In the manufacture method of the present invention, the material to be doped with the dopant is the above-described nanomaterial. The manufacture method of the present invention is characterized in that the dopant is an anion having basicity.

The Seebeck coefficient means a ratio of an open-circuit voltage to a difference between a temperature at a high-temperature joint and a temperature at a low-temperature joint in a circuit exhibiting a Seebeck effect ("McGraw-Hill Dictionary of Scientific and Technical Terms Third-Edition"). The Seebeck coefficient can be an indicator in determining a polarity of an electronic material such as a nanomaterial. More specifically, for example, a nanomaterial having a positive Seebeck coefficient value has p-type conductivity. On the other hand, a nanomaterial having a negative Seebeck coefficient value has n-type conductivity. The Seebeck coefficient can be measured by use of, for example, a Seebeck effect measurement device (manufactured by MMR Technologies, Inc.) employed in Examples which will be described later.

The wording "changing a Seebeck coefficient" herein means decreasing a Seebeck coefficient value or changing a Seebeck coefficient from a positive value to a negative value. Accordingly, the wording "dopant (or dopant composition) for changing a Seebeck coefficient of a nanomaterial" means (i) a dopant (or a dopant composition) capable of causing a Seebeck coefficient value of a nanomaterial doped with the dopant (or the dopant composition) to be lower than that prior to such doping or (ii) a dopant (or a dopant composition) capable of changing a Seebeck coefficient of a nanomaterial doped with the dopant (or the dopant composition) to a negative value from a positive value.

In the present specification, particularly, the dopant capable of changing a Seebeck coefficient of a nanomaterial from a positive value to a negative value may be referred to as an n-type dopant. In a case where the dopant is an n-type dopant, it is possible to cause a dopant composition-nanomaterial composite obtained by the manufacture method of the present invention to have n-type conductivity. Further, in a case where the dopant composition-nanomaterial composite has n-type conductivity, the dopant composition-nanomaterial composite can be used as an n-type material in a bipolar element. Accordingly, it is preferable that the dopant composition-nanomaterial composite has n-type conductivity.

The manufacture method of the present invention is characterized in that the dopant composition contains a given anion as the dopant. The anion changes a nanomaterial carrier from a hole to an electron. Accordingly, the above dopant composition changes a Seebeck coefficient of a nanomaterial.

The anion used in the manufacture method of the present invention is at least one selected from the group consisting of hydroxy ions, alkoxy ions, $SH^-$, $CH_3S^-$, $C_2H_5S^-$, cyanide ions, and carboxy ions. Hydroxy ions are represented by $OH^-$. Examples of alkoxy ions encompass $CH_3O^-$, $CH_3CH_2O^-$, i-PrO$^-$, and t-BuO$^-$. Cyanide ions are represented by $CN^-$. Examples of carboxy ions encompass $CH_3COO^-$. The anion is more preferably at least either $OH^-$ or $CH_3O^-$. The above anion can efficiently change a Seebeck coefficient of a nanomaterial.

One possible reason why an anion acts as a dopant is that the anion has an unshared electron pair. It is inferred that, via such an unshared electron pair, the anion interacts with a nanomaterial to be doped or induces a chemical reaction with a nanomaterial to be doped. Further, Examples described later suggests importance of Lewis basicity, intermolecular force, and dissociability of a dopant in doping efficiency. The term "Lewis basicity" herein means a property of donating an electron pair. A dopant having a higher Lewis basicity is considered to have a larger effect on a change in Seebeck coefficient. Further, the intermolecular force of the dopant is considered to be relevant to adsorption of the dopant to a nanomaterial. The intermolecular force of the dopant can be a hydrogen bond, a CH-π interaction, a π-π interaction, or the like. The dissociability of the dopant will be described later.

It is clear from the above that, out of the above anions, the anion is preferably an anion which forms a weak hydrogen bond. Examples of such an anion which forms a weak hydrogen bond encompass $OH^-$, $CH_3O^-$, $CH_3CH_2O^-$, i-PrO$^-$, and t-BuO$^-$. Further, the anion is preferably an anion which causes a π-π interaction. Examples of such an anion which causes a π-π interaction encompass $CH_3COO^-$.

According to the manufacture method of the present invention, the dopant composition contains the anion and a cation. The cation is an onium ion. The onium ion is well dissociable from the anion, and accordingly allows the anion to be efficiently dissociated from the onium ion. This makes it possible to efficiently dope, in a solvent, a nanomaterial with the anion serving as a dopant.

According to the manufacture method of the present invention, examples of the onium ion encompass onium ions having, as a skeleton, ammonium, phosphonium, oxonium, sulfonium, fluoronium, chloronium, carbocation, iminium, diazenium, nitronium, nitrilium, diazonium, nitrosonium, imidazolium, pyridinium, or the like. However, the onium ion is not limited to such onium ions. In view of dissociability in a solvent, the onium ion is preferably an onium ion having, as a skeleton, ammonium, phosphonium, imidazolium, or pyridinium.

The onium ion having, as a skeleton, ammonium or phosphonium is, for example, an onium ion represented by the following General Formula (I):

[Chem. 1]

(I)

where: Y is an nitrogen atom or a phosphorus atom; and $R_1$ through $R_4$ are each independently a hydrogen atom, an alkyl group having 1 to 16 carbon atom(s), an aryl group having 1 to 16 carbon atom(s), or —S—R. Note, here, that: S is an alkylene group having 1 to 16 carbon atom(s), the alkylene group serving as a spacer group; and R is a (meth)acryloyl group or an epoxy group.

The onium ion having imidazolium as a skeleton is, for example, an onium ion represented by the following General Formula (II):

[Chem. 2]

(II)

where: $R_1$ through $R_5$ are each independently a hydrogen atom, an alkyl group having 1 to 16 carbon atom(s), or —S—R. Note, here, that: S is an alkylene group having 1 to 16 carbon atom(s), the alkylene group serving as a spacer group; and R is a (meth)acryloyl group or an epoxy group.

The onium ion having pyridinium as a skeleton is, for example, an onium ion represented by the following General Formula (III):

[Chem. 3]

(III)

where $R_1$ through $R_6$ are each independently a hydrogen atom, an alkyl group having 1 to 16 carbon atom(s), or —S—R. Note, here, that: S is an alkylene group having 1 to 16 carbon atom(s), the alkylene group serving as a spacer group; and R is a (meth)acryloyl group or an epoxy group.

Furthermore, the onium ion can be, for example, an onium ion having a repeating unit represented by the following General Formula (IV):

[Chem. 4]

(IV)

where: Y is a nitrogen atom or a phosphorus atom; and n is an integer of not less than 1.

The dopant composition can contain a compound containing the anion and the onium ion. Examples of the compound containing the anion and the onium ion encompass compounds represented by the following formulae (a) through (g):

[Chem. 5]

(a)

(b)

(c)

(d)

(e)

(f)

(g)

The formula (a) represents tetramethylammonium hydroxide. The formula (b) represents tetraethylammonium hydroxide. The formula (c) represents trimethylphenylammonium hydroxide. The formula (d) represents 1-butyl-3-methylimidazolium hydroxide. The formula (e) represents tetrabutylammonium hydroxide. The formula (f) represents tetrabutylphosphonium hydroxide. The formula (g) represents tetrabutylammonium methoxide.

The compounds represented by the formula (a) through (g) are each well dissociable from the anion, capable of efficiently changing a Seebeck coefficient of a nanomaterial, and accordingly capable of changing the Seebeck coefficient of the nanomaterial from a positive value to a negative value. Therefore, the compounds represented by the formula (a) through (g) are preferably used.

As described above, according to the manufacture method of the present invention, the dissociability of the dopant is important in addition to the Lewis basicity and the intermolecular force of the dopant. It is preferable to dissociate more anions. Accordingly, a dissociation constant of the compound containing the anion and the cation is important. For example, the compound preferably has a dissociation constant pKa of not less than 7, more preferably not less than 14.

The dopant composition of the present invention can contain, as necessary, a substance other than the anion and the cation. Such a substance is not particularly limited, as long as the substance does not inhibit an action of the dopant.

Furthermore, the dopant composition of the present invention can contain more than one kind of dopant.

<Contact Step>

A contact step is the step of forming a composite of a dopant composition and a nanomaterial (a dopant composition-nanomaterial composite) by putting the dopant composition in contact with the nanomaterial in a solvent, the dopant composition being a composition for changing a Seebeck coefficient of the nanomaterial.

The contact step is not particularly limited in method, as long as the nanomaterial and the dopant composition are put in contact with each other in the contact step. For example, the nanomaterial and the dopant composition can be put in contact with each other by adding and suspending the nanomaterial in a solution in which the dopant composition is dissolved in the solvent. For sufficiently putting the dopant composition and the nanomaterial in contact with each other, the nanomaterial and the dopant are preferably put in contact with each other by impregnating the nanomaterial with the solution in which the dopant composition is dissolved in the solvent or by shear dispersion of the nanomaterial in the solution in which the dopant composition is dissolved in the solvent.

Further, it is preferable that the nanomaterial and the dopant composition be put in contact with each other while the nanomaterial is being dispersed in the solution by use of a homogenization apparatus. Such dispersion of the nanomaterial in the solution by use of the homogenization apparatus allows the dopant composition to easily come in contact with the nanomaterial. This consequently allows the dopant composition and the nanomaterial to come in sufficient contact with each other.

The homogenization apparatus is not particularly limited, as long as the homogenization apparatus can homogeneously disperse the nanomaterial in the solution. The homogenization apparatus can be known means such as a homogenizer or an ultrasonic homogenizer. Note that in the present specification, the simple wording "homogenizer" means a "stirring homogenizer".

In regard to an operating condition of the homogenization apparatus, the operating condition is not particularly limited, as long as the homogenization apparatus can disperse the nanomaterial in the solvent under the operating condition. For example, in a case where the homogenization apparatus is a homogenizer, the nanomaterial can be dispersed in the solvent to which the nanomaterial and the dopant composition are added, by stirring the solvent for forming a suspension at room temperature (23° C.) for 10 minutes at a stirring speed (number of revolutions) of 20000 rpm of the homogenizer.

The solvent in which the dopant composition is to be dissolved can be, for example, water or an organic solvent. Accordingly, the manufacture method of the present invention is applicable to various nanomaterials. The organic solvent can be a highly-polar solvent such as alcohol (e.g., methanol, ethanol, or, isopropyl alcohol), ketone (e.g., acetone, methyl ethyl ketone, or methyl isobutyl ketone), dimethyl sulfoxide, or, dimethyl formamide. The present invention is not limited to the above solvents.

The dopant composition can be dissolved at any concentration in the solvent. For example, a concentration of tetramethylammonium hydroxide in methanol can be not less than 0.001 mol/L.

<Dry Step>

A dry step is the step of drying a mixture, obtained from the dopant composition and the nanomaterial, so as to remove the solvent. The dry step is not particularly limited in method for removing the solvent. For example, a method employing a vacuum oven can be used. Note that the solvent is not always necessary to be completely removed. That is, the solvent can remain, provided that the solvent does not hinder the effects of the present invention. According to the manufacture method of the present invention, the anion and the cation have good dissociability. Therefore, the dopant composition-nanomaterial composite obtained in the dry step has the anion and the cation in a state where the anion and the cation are dissociated from each other. That is, according to the dopant composition-nanomaterial composite, the nanomaterial is efficiently doped with the anion.

Furthermore, the anion serves as the dopant used in the manufacture method of the present invention. As compared to conventional dopants, the anion is more easily available and less expensive. Moreover, the solvent can be either an aqueous solvent or an organic solvent. Therefore, the manufacture method of the present invention is applicable to various nanomaterials. Further, the manufacture method of the present invention does not require a complex step such as heating. This makes it possible to simply and efficiently manufacture the dopant composition-nanomaterial composite. Accordingly, the manufacture method of the present invention can simply and efficiently change a Seebeck coefficient of a nanomaterial.

<Molding Step>

The manufacture method of the present invention can include the step of molding the nanomaterial or the dopant composition-nanomaterial composite into a desired form. For example, in a molding step, the nanomaterial or the dopant composition-nanomaterial composite can be molded into a film form.

Note, here, that the term "film form" can be reworded as "sheet form" or "layer form". The wording "molding into a film form" means molding the nanomaterial or the dopant composition-nanomaterial composite into a film of 1 μm to 1000 μm in thickness.

A method for molding the nanomaterial or the dopant composition-nanomaterial composite into a film form is not particularly limited, and can be, for example, a method employing a membrane filter. Specifically, the nanomaterial or the dopant composition-nanomaterial composite can be molded into a film form by (i) subjecting a suspension of the nanomaterial or the dopant composition-nanomaterial composite to suction filtration by use of a membrane filter having a pore size of 0.1 μm to 2 μm and (ii) drying a resultant film in vacuum at a temperature in a range of 50° C. to 150° C. for 1 hour to 24 hours.

In the manufacture method of the present invention, the nanomaterial can be molded prior to the contact step or the dopant composition-nanomaterial composite can be molded after the contact step. In a case where the molding step is carried out after the contact step, the dopant composition can be sufficiently adsorbed to each nanomaterial dispersed in the solvent. This makes it possible to obtain a film-form material in which nanomaterials are more uniformly doped. Therefore, in a case where the molding step is carried out after the contact step, there is no concern about cancellation of a Seebeck effect which cancellation is caused by, for example, the film-form material containing both doped nanomaterials having n-type conductivity and undoped nanomaterials having p-type conductivity.

[Dopant Composition-Nanomaterial Composite]

A dopant-nanomaterial composite in accordance with the present invention (hereinafter, also referred to as "dopant composition-nanomaterial composite of the present invention") contains the nanomaterial and the dopant which are described above, and is characterized in that the dopant-nanomaterial composite is manufactured by the manufacture method of the present invention. In other words, the dopant-nanomaterial composite of the present invention contains a nanomaterial and a dopant composition for changing a Seebeck coefficient of the nanomaterial, and the dopant composition contains an anion and a cation. The anion is at least one selected from the group consisting of hydroxy ions, alkoxy ions, thio ions, alkyl thio ions, cyanide ions, and carboxy ions. The cation is an onium ion. Further, the anion and the cation have good dissociability, as has been described. Therefore, the dopant composition contains the anion and the cation in a state where the anion and the cation are dissociated from each other. Note that descriptions on the matters described in the preceding section [Method for Manufacturing Dopant Composition-Nanomaterial Composite] will be omitted here.

The dopant composition-nanomaterial composite of the present invention preferably exhibits n-type conductivity. When the dopant composition-nanomaterial composite has n-type conductivity, this dopant composition-nanomaterial composite can be used as an n-type material in a bipolar element.

The dopant composition-nanomaterial composite of the present invention can contain a substance other than the nanomaterial and the dopant composition. Such a substance is not limited in kind.

The present invention is not limited to the embodiments, but can be altered within the scope of the claims. An embodiment derived from a proper combination of technical means each disclosed in a different embodiment is also encompassed in the technical scope of the present invention.

The present invention can be also arranged as follows.

That is, the method, in accordance with the present invention, for manufacturing a dopant-nanomaterial composite is a method for manufacturing a dopant composition-nanomaterial composite, the method including the steps of: (a) putting a dopant composition in contact with a nanomaterial in a solvent; and (b) drying a mixture obtained in the step (a) so as to remove the solvent, the dopant composition being a composition for changing a Seebeck coefficient of the nanomaterial, the dopant composition containing an anion and a cation, the anion being at least one selected from the group consisting of hydroxy ions, alkoxy ions, thio ions, alkyl thio ions, cyanide ions, and carboxy ions, the cation being an onium ion, a dopant composition-nanomaterial composite obtained in the step (b) having the anion and the cation in a state where the anion and the cation are dissociated from each other.

Such a combination of the anion and the cation is good in dissociability. Therefore, it is possible to dissociate the anion and the cation from each other, and possible to efficiently dope the nanomaterial with the anion. The anion changes a nanomaterial carrier from a hole to an electron. Accordingly, the dopant composition changes a Seebeck coefficient of the nanomaterial.

The anion is contained in various compounds and, accordingly, easily available. Moreover, the anion is one form of an ion, and accordingly, can be used in both an aqueous solvent and an organic solvent. Further, the above arrangement does not require an operation such as heating. In addition, the dopant composition is capable of doping various nanomaterials.

Therefore, the above arrangement makes it possible to simply and efficiently change a Seebeck coefficient value of a nanomaterial.

The method in accordance with the present invention can be arranged such that the anion is at least one selected from the group consisting of $OH^-$, $CH_3O^-$, $CH_3CH_2O^-$, i-$PrO^-$, t-$BuO^-$, $SH^-$, $CH_3S^-$, $C_2H_5S^-$, $CN^-$ and $CH_3COO^-$.

The method in accordance with the present invention can be arranged such that the nanomaterial is at least one selected from the group consisting of nanoparticles, nanotubes, nanowires, nanorods and nanosheets.

The method in accordance with the present invention can be arranged such that, in the step (a), the nanomaterial and the dopant composition are put in contact with each other by impregnating the nanomaterial with a solution in which the dopant composition is dissolved in the solvent or by shear dispersion of the nanomaterial in the solution in which the dopant composition is dissolved in the solvent.

The method in accordance with the present invention can be arranged such that the anion is an n-type dopant.

A dopant composition-nanomaterial composite in accordance with the present invention is a dopant composition-nanomaterial composite manufactured by the method, in accordance with the present invention, for manufacturing a dopant-nanomaterial composite.

A dopant composition in accordance with the present invention is a dopant composition for changing a Seebeck coefficient of a nanomaterial, the dopant composition including: an anion; and a cation, the anion being at least one selected from the group consisting of hydroxy ions, alkoxy ions, thio ions, alkyl thio ions, cyanide ions, and carboxy ions, the cation being an onium ion.

The dopant composition in accordance with the present invention can be arranged such that the anion is at least one selected from the group consisting of $OH^-$, $CH_3O^-$, $CH_3CH_2O^-$, $i\text{-}PrO^-$, $t\text{-}BuO^-$, $SH^-$, $CH_3S^-$, $C_2H_5S^-$, $CN^-$, and $CH_3COO^-$.

The dopant composition in accordance with the present invention can be arranged such that the anion is an n-type dopant.

A dopant composition-nanomaterial composite in accordance with the present invention is a dopant composition-nanomaterial composite including: a nanomaterial; and the dopant composition in accordance with the present invention, wherein the dopant composition may contain the anion and the cation in a state where the anion and the cation are dissociated from each other.

It has not been known so far that a Seebeck coefficient of a nanomaterial can be changed by using ions. The inventors of the present invention have first found such a fact. Note here that though benzylviologen described in Non-Patent Literature 6 is an ionic substance, Non-Patent Literature 6 discloses a technique characterized by using benzylviologen which has been reduced (that is, benzylviologen which is not in the form of an ion).

EXAMPLES

The following description will discuss Examples of the present invention with reference to FIGS. 2 through 7.

[Doping with Onium Salt]

An effect of doping was examined by use of a compound (onium salt) containing an anion and an onium ion.

Example 1

As an onium salt, tetramethylammonium hydroxide (TMAH) was used. Into 20 mL of methanol in which 0.1 M of TMAH was dissolved, 5 mg of a bundle of carbon nanotubes were added. A resultant mixture was subjected to shear dispersion at 20000 rpm for 10 minutes by use of a high-speed homogenizer (manufactured by Ultra-Turrax).

A resultant dispersion liquid of the carbon nanotubes was subjected to suction filtration by use of a Teflon (registered trademark) membrane filter having a pore size of 0.2 μm. Further, after the membrane filter was dried under reduced pressure for 12 hours, a carbon-nanotube film was peeled off from the membrane filter.

Then, a Seebeck coefficient of the carbon-nanotube film thus obtained was measured by use of a Seebeck effect measurement device SB-200 (manufactured by MMR Technologies, Inc.). The carbon-nanotube film was evaluated at 310 K (a temperature displayed by the Seebeck effect measurement device). Note that carbon-nanotube films for measurement were prepared for both (i) a case where the carbon nanotubes were made of a single walled carbon nanotube (hereinafter, also referred to as SGCNT) manufactured by National Institute of Advanced Industrial Science and Technology and (ii) a case where the carbon nanotubes were made of a single walled carbon nanotube (hereinafter, also referred to as KHCNT) manufactured by KH Chemicals. Hereinafter, the resultant carbon-nanotube film is also referred to as a CNT film.

Example 2

CNT films were prepared as in Example 1, except that tetraethylammonium hydroxide (TEAH) was used in place of TMAH. Then, respective Seebeck coefficients of the CNT films were measured.

Example 3

CNT films were prepared as in Example 1, except that tetrabutylammonium hydroxide (TBAH) was used in place of TMAH. Then, respective Seebeck coefficients of the CNT films were measured.

Example 4

CNT films were prepared as in Example 1, except that trimethylphenylammonium hydroxide (TPAH) was used in place of TMAH. Then, respective Seebeck coefficients of the CNT films were measured.

Example 5

CNT films were prepared as in Example 1, except that tetrabutylphosphonium hydroxide (TBPH) was used in place of TMAH. Then, respective Seebeck coefficients of the CNT films were measured.

Example 6

CNT films were prepared as in Example 1, except that 1-butyl-3-methylimidazolium hydroxide (ImH) was used in place of TMAH. Then, respective Seebeck coefficients of the CNT films were measured.

Example 7

CNT films were prepared as in Example 1, except that tetrabutylammonium methoxide (TBAM) was used in place of TMAH. Then, respective Seebeck coefficients of the CNT films were measured.

Comparative Example 1

CNT films were prepared as in Example 1, except that no dopant was added (that is, TMAH was not added). Then, respective Seebeck coefficients of the CNT films were measured.

Comparative Example 2

CNT films were prepared as in Example 1, except that tetraethylammonium iodide (TEAI) was used in place of TMAH. Then, respective Seebeck coefficients of the CNT films were measured.

Comparative Example 3

CNT films were prepared as in Example 1, except that tetramethylammonium chloride (TMACl) was used in place of TMAH. Then, respective Seebeck coefficients of the CNT films were measured.

Comparative Example 4

CNT films were prepared as in Example 1, except that tetramethylammonium bromide (TMABr) was used in place of TMAH. Then, respective Seebeck coefficients of the CNT films were measured.

Comparative Example 5

CNT films were prepared as in Example 1, except that tetramethylammonium nitrate (TMANO$_3$) was used in place of TMAH. Then, respective Seebeck coefficients of the CNT films were measured.

Comparative Example 6

CNT films were prepared as in Example 1, except that tetramethylammonium tetrafluoroborate (TMABF$_4$) was used in place of TMAH. Then, respective Seebeck coefficients of the CNT films were measured.

Comparative Example 7

CNT films were prepared as in Example 1, except that tetraethylammonium perchlorate (TEAClO$_4$) was used in place of TMAH. Then, respective Seebeck coefficients of the CNT films were measured.

Comparative Example 8

CNT films were prepared as in Example 1, except that tetraethylammonium trifluoromethanesulfonate (TEATfO) was used in place of TMAH. Then, respective Seebeck coefficients of the CNT films were measured.

Comparative Example 9

CNT films were prepared as in Example 1, except that tetraethylammonium p-toluenesulfonate (TEATos) was used in place of TMAH. Then, respective Seebeck coefficients of the CNT films were measured.

<Experimental Results>

Figure 2:
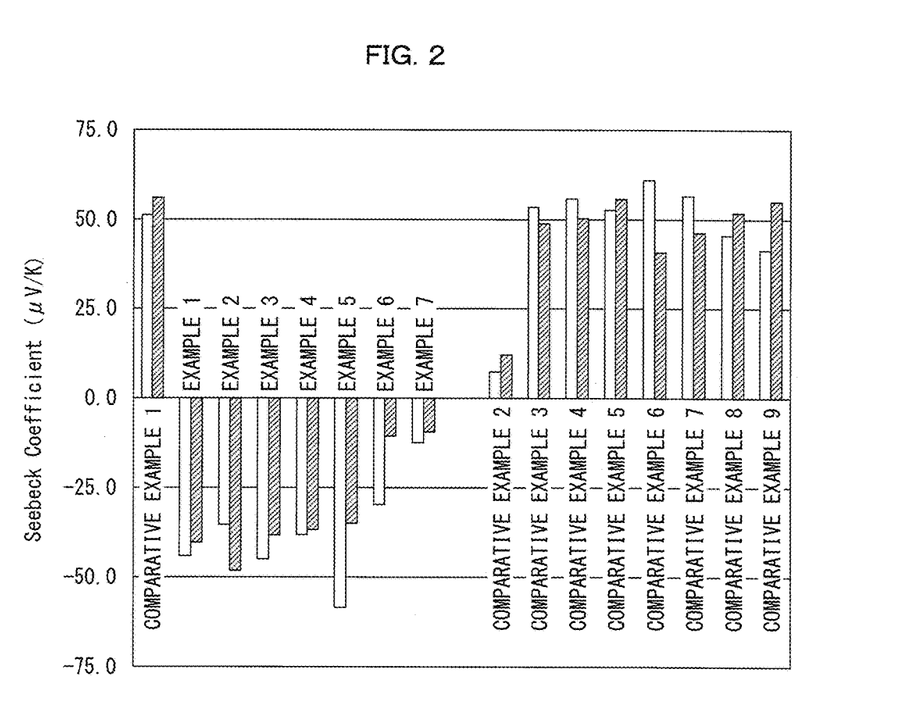
FIG. 2 is a chart illustrating respective Seebeck coefficients of carbon-nanotube (CNT) films that are obtained in Examples 1 through 7 and Comparative Examples 1 through 9.

FIG. 2 shows results of Examples 1 through 7 and Comparative Examples 1 through 9. It is clear from Comparative Example 1 that undoped CNT films exhibit p-type conductivity. In Examples 1 through 7, the CNT films exhibited n-type conductivity. On the other hand, in Comparative Examples 2 through 9, the CNT films exhibited p-type conductivity as is the case with those in Comparative Example 1.

It was confirmed from the above results that, unlike a Seebeck coefficient value of an untreated CNT film which has not been doped, a Seebeck coefficient value of a CNT film manufactured with use of an onium salt in the manufacture method of the present invention can be changed. This is because the onium salt has good dissociability in a solvent. Furthermore, it was confirmed that, in a case where TMAH, TEAH, TBAH, TPAH, TBPH, ImH, or TBAM is used as the onium salt in the manufacture method of the present invention, it is possible to greatly change a Seebeck coefficient value of a CNT film so that the Seebeck coefficient value can be changed from a positive value to a negative value.

Doping in Field-Effect Transistor

Example 8

Figure 3:
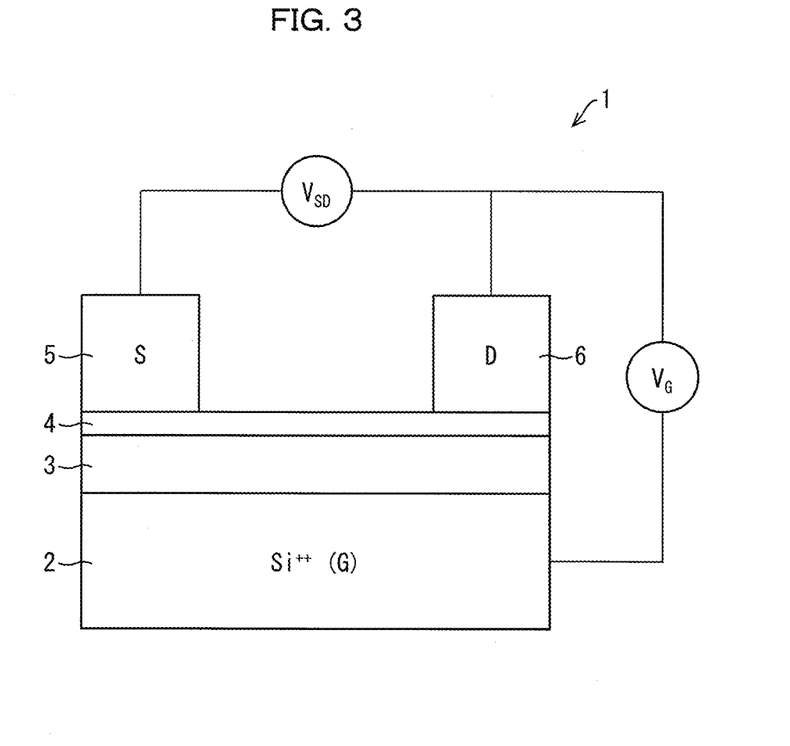
FIG. 3 is a view schematically illustrating a field-effect transistor prepared in Example 8.

A field-effect transistor 1 as illustrated in FIG. 3 was prepared so as to examine an effect of doping a carbon nanotube. The field-effect transistor 1 was configured such that an insulating layer 3 (having a thickness of 300 nm) made of SiO$_2$ was formed on a gate 2 (G) made of doped Si. Further, an active layer 4 made of a carbon-nanotube thin film (having a thickness of less than 50 nm) was formed on the insulating later 3. A source electrode 5 (S) made of gold (having a thickness of 45 nm) and chrome (having a thickness of 5 nm) was formed on the active layer 4. As is the case with the source electrode, a drain electrode 6 (D) made of gold (having a thickness of 45 nm) and chrome (having a thickness of 5 nm) was formed on the active layer 4.

<Experimental Results>

Figure 4:
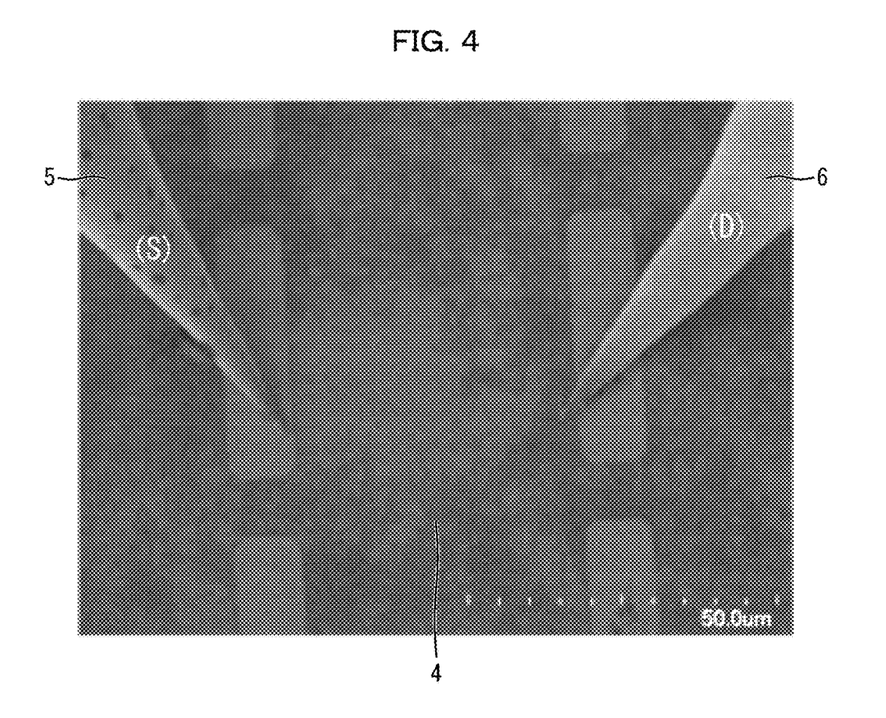
FIG. 4 is a view illustrating the field-effect transistor, prepared in Example 8, which is observed.
Figure 5:
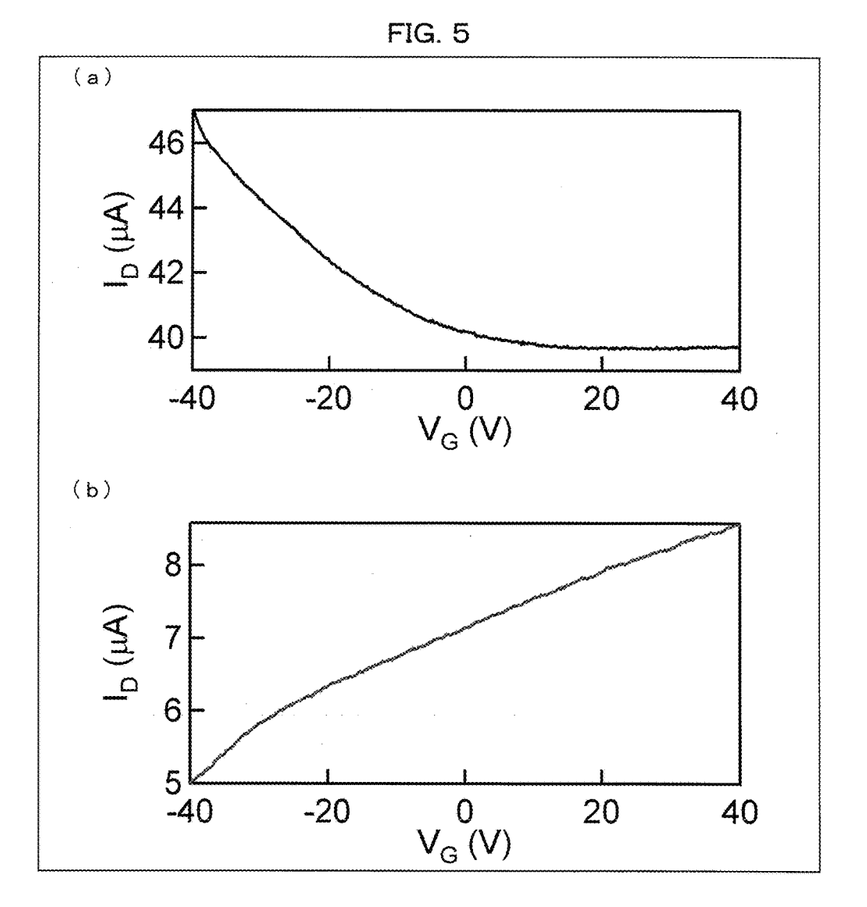
FIG. 5 is a view illustrating a relationship between a drain current and a gate voltage of the field-effect transistor prepared in Example 8. (a) of FIG. 5 illustrates a result obtained before a dopant is added. (b) of FIG. 5 illustrates a result obtained after a dopant is added.

The field-effect transistor thus obtained was evaluated with use of a Hitachi micro device characterization apparatus nanoEBAC (registered trademark) NE4000. FIG. 4 is a view illustrating the field-effect transistor 1, illustrated in FIG. 3, which is observed from a direction in which the source electrode 5 and the drain electrode 6 were formed. (a) of FIG. 5 illustrates a result of measuring a drain current $I_D$ at a voltage $V_{SD}$ of 1 (one) V. As is clear from (a) of FIG. 5, it is found that, in a case where an undoped carbon nanotube is used as an active layer, the active layer (carbon-nanotube thin film) exhibits p-type conductivity.

Next, a solvent (methanol) in which 0.01 M of TMAH was dissolved was added to the carbon-nanotube thin film. (b) of FIG. 5 illustrates a result of measuring the drain current again. As is clear from (b) of FIG. 5, it is found that, in a case where TMAH is used, an active layer (carbon-nanotube thin film) exhibits n-type conductivity. Therefore, the effects of the manufacture method of the present invention were confirmed by evaluating, not only the CNT films, but also the field-effect transistor.

[Doping of Multi-Walled Carbon Nanotube]

The effect of doping was examined with use of a multi-walled carbon nanotube in place of the foregoing single walled carbon nanotubes.

Example 9

NT-7 (manufactured by Hodogaya Chemical Co., Ltd., having an average fiber diameter of 65 nm) was used as the multi-walled carbon nanotube. Further, TMAH was used as the compound containing an anion. 5 mg of the multi-walled carbon nanotube was added to 20 mL of methanol in which 0.1 M of TMAH was dissolved. A resultant mixture was subjected to shear dispersion at 20000 rpm for 10 minutes by use of a high-speed homogenizer (manufactured by Ultra-Turrax).

A resultant dispersion liquid of the carbon nanotube was subjected to suction filtration by use of a Teflon (registered trademark) membrane filter having a pore size of 0.2 μm. Further, after the membrane filter was dried under reduced pressure for 12 hours, a carbon-nanotube film was peeled off from the membrane filter.

Then, a Seebeck coefficient of the carbon-nanotube film thus obtained was measured by use of a Seebeck effect measurement device SB-200 (manufactured by MMR Technologies, Inc.). The carbon-nanotube film was evaluated at 310 K (a temperature displayed by the Seebeck effect measurement device).

Example 10

A CNT film was prepared as in Example 9, except that CT-12 (manufactured by Hodogaya Chemical Co., Ltd., having an average fiber diameter of 110 nm) was used as the multi-walled carbon nanotube. Then, a Seebeck coefficient of the CNT film was measured.

Example 11

A CNT film was prepared as in Example 9, except that CT-15 (manufactured by Hodogaya Chemical Co., Ltd., having an average fiber diameter of 150 nm) was used as the multi-walled carbon nanotube. Then, a Seebeck coefficient of the CNT film was measured.

Comparative Example 10

A CNT film was prepared as in Example 9, except that no TMAH was added. Then, a Seebeck coefficient of the CNT film was measured.

Comparative Example 11

A CNT film was prepared as in Example 10, except that no TMAH was added. Then, a Seebeck coefficient of the CNT film was measured.

Comparative Example 12

A CNT film was prepared as in Example 11, except that no TMAH was added. Then, a Seebeck coefficient of the CNT film was measured.

<Experimental Results>

Figure 6:
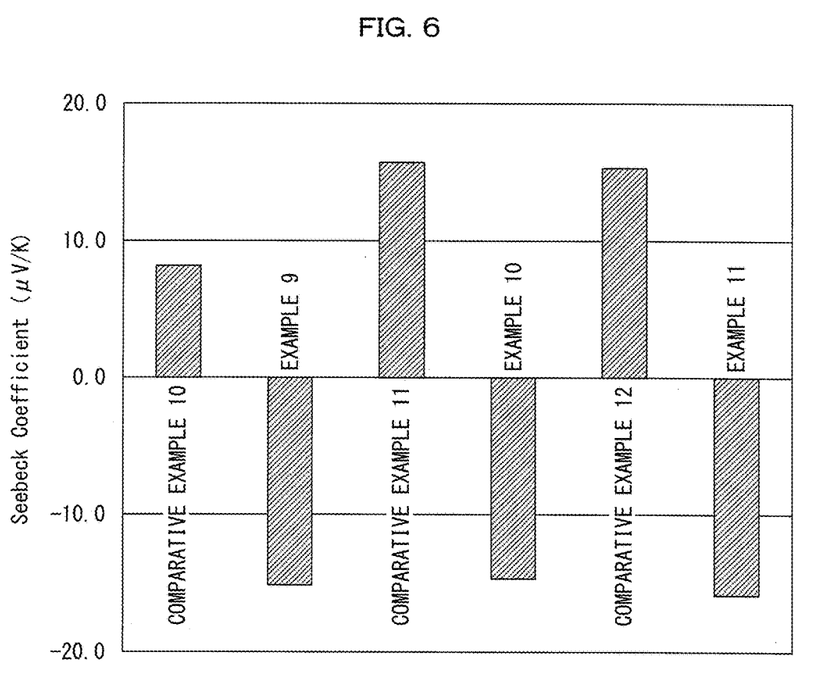
FIG. 6 is a chart illustrating respective Seebeck coefficients of carbon-nanotube (CNT) films that are obtained in Examples 9 through 11 and Comparative Examples 10 through 12.

FIG. 6 shows results of Examples 9 through 11 and Comparative Examples 10 through 12. In a case where no dopant was used, the CNT films exhibited p-type conductivity. In contrast, in a case where a dopant was used as shown in Examples 9 through 11, it was possible to greatly change the Seebeck coefficients so that the CNT films exhibited n-type conductivity.

It was confirmed from the above results that, unlike a Seebeck coefficient value of an untreated CNT film which has not been doped, a Seebeck coefficient value of a CNT film manufactured with use of a multi-walled carbon nanotube, serving as a nanomaterial, in the manufacture method of the present invention can be greatly changed so that the Seebeck coefficient value can be changed from a positive value to a negative value. Furthermore, it was confirmed that, according to the manufacture method of the present invention, it is possible to bring about effects on various multi-walled carbon nanotubes having respective different average fiber diameters.

[Doping of Graphene]

The effect of doping was examined with use of graphene in place of the carbon nanotube.

Example 12

Reduced graphene oxide (single walled) was used as a nanomaterial. Further, TMAH was used as the compound containing an anion. 5 mg of the reduced graphene oxide was added to 20 mL of methanol in which 0.1 M of TMAH was dissolved. A resultant mixture was subjected to shear dispersion at 20000 rpm for 10 minutes by use of a high-speed homogenizer (manufactured by Ultra-Turrax).

A resultant dispersion liquid of the reduced graphene oxide was subjected to suction filtration by use of a Teflon (registered trademark) membrane filter having a pore size of 0.2 µm. Further, after the membrane filter was dried under reduced pressure for 12 hours, a reduced-graphene-oxide film was peeled off from the membrane filter.

Then, a Seebeck coefficient of the reduced-graphene-oxide film thus obtained was measured by use of a Seebeck effect measurement device SB-200 (manufactured by MMR Technologies, Inc.). The reduced-graphene-oxide film was evaluated at 310 K (a temperature displayed by the Seebeck effect measurement device).

Furthermore, a Seebeck coefficient of a reduced-graphene-oxide film prepared without use of TMAH was similarly measured.

<Experimental Results>

In a case where no dopant was used, the reduced-graphene-oxide film exhibited p-type conductivity (Seebeck coefficient: 11 µV/K). In contrast, in a case where a dopant was used, the reduced-graphene-oxide film exhibited n-type conductivity (Seebeck coefficient: −6.2 µV/K).

It was confirmed from the above results that, unlike a Seebeck coefficient value of an untreated film which has not been doped, a Seebeck coefficient value of a film manufactured with use of graphene, serving as a nanomaterial, in the manufacture method of the present invention can be greatly changed so that the Seebeck coefficient value can be changed from a positive value to a negative value.

[Doping of Te Nanowires]

The effect of doping was examined with use of nanowires (Te nanowires), made of tellurium, in place of the carbon nanotube.

Example 13

Figure 7:
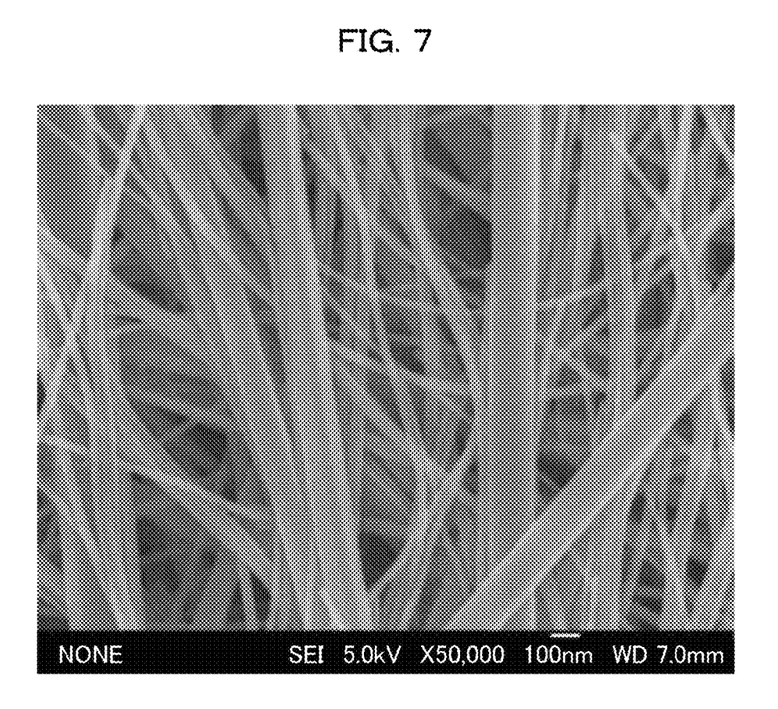
FIG. 7 is a view illustrating Te nanowires, obtained in Example 13, which are observed.

Te nanowires were used as a nanomaterial. Further, TMAH was used as the compound containing an anion. First, 4.99 mg (22.5 mmol) of $Na_2TeO_3$, 7.5 g of polyvinylpyrrolidone, 4.5 g of NaOH, and 150 mL of ethylene glycol were added to a 500 mL three-necked flask. One of three necks of the three-necked flask was connected to a vacuum/nitrogen line, while the other ones of the three necks were sealed with use of septum. An inside of this system was deaerated for 15 minutes at a room temperature, and air inside the system was replaced with $N_2$. The three-necked flask was then heated so that a temperature of the system was increased to 160° C. (temperature increase rate of 15° C./min). With such an increase in temperature, a solution gradually turned from colorless and transparent to purple. In a state where the temperature of the system was 160° C., 7.5 mL of hydrazine monohydrate was added to the system, and then tellurium was reduced while being heated for 10 minutes. Thereafter, heating was stopped, and the system was stirred under a nitrogen atmosphere until the temperature of the system was returned to the room temperature. By the above method, the Te nanowires were obtained. FIG. 7 illustrates a result of observing, with use of an SEM, the Te nanowires thus obtained.

5 mg of the Te nanowires thus obtained were added to 20 mL of methanol in which 0.1 M of TMAH was dissolved. A resultant mixture was subjected to shear dispersion at 20000 rpm for 10 minutes by use of a high-speed homogenizer (manufactured by Ultra-Turrax).

A resultant dispersion liquid of the Te nanowires was subjected to suction filtration by use of a Teflon (registered trademark) membrane filter having a pore size of 0.2 µm. Further, after the membrane filter was dried under reduced pressure for 12 hours, a Te-nanowire film was peeled off from the membrane filter.

Then, a Seebeck coefficient of the Te-nanowire film thus obtained was measured by use of a Seebeck effect measurement device SB-200 (manufactured by MMR Technologies, Inc.). The Te-nanowire film was evaluated at 310 K (a temperature displayed by the Seebeck effect measurement device).

Furthermore, a Seebeck coefficient of a Te-nanowire film prepared without use of TMAH was similarly measured.

<Experimental Results>

In a case where no dopant was used, the Te-nanowire film exhibited p-type conductivity (Seebeck coefficient: 523 μV/K). In contrast, in a case where a dopant was used, the Te-nanowire film exhibited n-type conductivity (Seebeck coefficient: −445 μV/K).

It was confirmed from the above results that, unlike a Seebeck coefficient value of an untreated film which has not been doped, a Seebeck coefficient value of a film manufactured with use of nanowires (nanomaterial other than a carbon material), such as a semiconductor and a semimetal, in the manufacture method of the present invention can be greatly changed so that the Seebeck coefficient value can be changed from a positive value to a negative value.

INDUSTRIAL APPLICABILITY

Doped nanomaterials can be tools for construction of various devices such as field-effect transistors, thermoelectric conversion elements, and photovoltaic cells. Accordingly, the present invention can be applied to various industries in a wide range of fields in which nanomaterials are used.

REFERENCE SIGNS LIST

1 Field-effect transistor
2 Gate
3 Insulating layer
4 Active layer
5 Source electrode
6 Drain electrode

The invention claimed is:

1. A method for manufacturing a dopant composition-nanomaterial composite, the method comprising the steps of:
   (a) putting a dopant composition in contact with a nanomaterial in a solvent; and
   (b) drying a mixture obtained in the step (a) so as to remove the solvent,
   wherein the dopant composition is a composition for changing a Seebeck coefficient of the nanomaterial,
   wherein the dopant composition contains an anion and a cation,
   wherein the anion is at least one selected from the group consisting of hydroxy ions, alkoxy ions, SH⁻, CH₃S⁻, C₂H₅S⁻, cyanide ions, and carboxy ions,
   wherein the cation is
      an onium ion represented by formula (I):

(I)

where Y is a nitrogen atom or a phosphorus atom;
   and R₁ through R₄ are each independently an alkyl group having 1 to 16 carbon atom(s), or
an onium ion having, as a skeleton, oxonium, sulfonium, fluoronium, chloronium, carbocation, iminium, diazenium, nitronium, nitrilium, diazonium, nitrosonium, imidazolium, or pyridinium, and
wherein the dopant composition-nanomaterial composite obtained in the step (b) contains both the anion and the cation, and the anion and the cation are dissociated from one another.

2. The method as set forth in claim 1, wherein the anion is at least one selected from the group consisting of OH⁻, CH₃O⁻, CH₃CH₂O⁻, i-PrO⁻, t-BuO⁻, SH⁻, CH₃S⁻, C₂H₅S⁻, CN⁻ and CH₃COO⁻.

3. The method as set forth in claim 1, wherein the nanomaterial is at least one selected from the group consisting of nanoparticles, nanotubes, nanowires, nanorods and nanosheets.

4. The method as set forth in claim 1, wherein, in the step (a), the nanomaterial and the dopant composition are put in contact with each other by impregnating the nanomaterial with a solution in which the dopant composition is dissolved in the solvent or by shear dispersion of the nanomaterial in the solution in which the dopant composition is dissolved in the solvent.

5. The method as set forth in claim 1, wherein the anion is an n-type dopant.

6. A dopant composition-nanomaterial composite comprising:
   a nanomaterial; and
   a dopant composition,
   wherein the dopant composition is a composition for changing a Seebeck coefficient of the nanomaterial,
   wherein the dopant composition contains an anion and a cation,
   wherein the anion is at least one selected from the group consisting of hydroxy ions, alkoxy ions, SH⁻, CH₃S⁻, C₂H₅S⁻, cyanide ions, and carboxy ions,
   wherein the cation is
      an onium ion represented by formula (I):

(I)

where Y is a nitrogen atom or a phosphorus atom;
   and R₁ through R₄ are each independently an alkyl group having 1 to 16 carbon atom(s), or
an onium ion having, as a skeleton, oxonium, sulfonium, fluoronium, chloronium, carbocation, iminium, diazenium, nitronium, nitrilium, diazenium, nitrosonium, imidazolium, or pyridinium, and
wherein the dopant composition-nanomaterial composite contains both the anion and the cation, and the anion and the cation are dissociated from one another.

* * * * *